United States Patent [19]

Ishikawa et al.

[11] Patent Number: 5,107,170
[45] Date of Patent: Apr. 21, 1992

[54] ION SOURCE HAVING AUXILLARY ION CHAMBER

[75] Inventors: Junzo Ishikawa; Yoshio Matsubara; Hideaki Takara; Shuichi Nogawa; Toshiaki Sasai, all of Kyoto, Japan

[73] Assignee: Nissin Electric Co., Ltd., Kyoto, Japan

[21] Appl. No.: 422,724

[22] Filed: Oct. 17, 1989

[30] Foreign Application Priority Data

Oct. 18, 1988 [JP] Japan .................. 63-262582
Mar. 10, 1989 [JP] Japan .................. 1-59212
Mar. 10, 1989 [JP] Japan .................. 1-59213
Mar. 20, 1989 [JP] Japan .................. 1-31612[U]
Apr. 13, 1989 [JP] Japan .................. 1-93860

[51] Int. Cl.$^5$ .................. H05A 13/00; H01J 7/24
[52] U.S. Cl. .................. 313/362.1; 313/231.31; 315/111.21
[58] Field of Search .................. 313/362.1, 231.31; 315/111.21, 111.41, 111.81, 111.91; 250/423 F

[56] References Cited

U.S. PATENT DOCUMENTS 4,757,237  7/1988  Hellblom et al. .......... 313/231.31 X
4,810,935  3/1989  Boswell .................. 315/111.21 X
4,859,909  8/1989  Gualandris et al. ....... 313/231.31 X Primary Examiner—Sandra L. O'Shea
Attorney, Agent, or Firm—Sughrue, Mion, Zinn, Macpeak & Seas

[57] ABSTRACT

An ion source having an auxiliary plasma chamber and a main plasma chamber. The auxiliary plasma chamber receives an ionizable gas and is provided with microwaves with sufficient power to create a high frequency discharge and generate a subplasma for sustaining the creation of an ion plasma in the main chamber. Multiple auxiliary plasma chambers may be used and each may be separately regulated. Protective plates, screens, and coatings may be provided to protect the ion plasma of the main chamber from sputtering a facing wall of the auxiliary plasma chamber.

18 Claims, 13 Drawing Sheets

ION SOURCE HAVING AUXILLARY ION CHAMBER

BACKGROUND OF THE INVENTION

The present invention relates to an ion source for generating ion beams by d.c. discharge.

Kaufman-type and bucket-type ion sources are heretofore known as typical examples of ion sources used for ion beam sputtering, ion beam mixing, ion assisting, etc.

FIG. 1 is a block diagram of a Kaufman-type ion source which comprises a nonmagnetic metal cubic body 1 of stainless steel or the like, a plasma generating chamber 2 formed with the cubic body 1, a filament 3 provided in the plasma generating chamber 2, the filament 3 being composed of tungsten W, lanthanum boride ($LaB_6$) or the like, a filament power source 4 for heating the filament 3, a tubular anode 5 provided in the plasma generating chamber 2, an inlet 6 for introducing gas into the plasma generating chamber 2, a group of ion-beam drawing electrodes 7 consisting of first electrodes 8, second electrodes 9 and third electrodes 10, a permanent magnet or electromagnet 11 provided outside the cubic body 1 and used for generating a cylindrical magnetic field, an arc source 12 whose positive electrode is connected to the anode 5 and whose negative electrode is connected via a resistor 13 to the cubic body 1, the arc source 12 being used for applying anode voltage to the anode 5, an accelerating power source 14 whose positive electrode is connected to the negative electrode of the arc source 12 so as to apply a positive accelerating voltage lower than the anode voltage to the first electrodes 8 which is at the same potential as that of the cubic body 1, and a decelerating power source 15 for applying a negative voltage to the second electrodes 9.

The filament 3 is a cathode which functions as a thermion emission source and is caused to have high temperatures by resistance heating derived from the filament power source to emit thermions e, In the case of tungsten or lanthanum boride, for instance, the filament is heated up to approximately 2,400° C. or 1,300° C.

On the other hand, ionizing gas, e.g., rare gas such as argon gas or reactive gas such as oxygen gas, is introduced from the gas inlet 6 into the plasma generating chamber 2.

A plasma 16 of ionized gas is generated by the discharge between the filament 3 and the anode 5 and, because of the beam drawing action of the group of electrodes 7, the ion gas in the plasma in the form of an ion beam is led out of cubic body 1 to a sputtering chamber.

The generation and enclosure of the plasma 16 is improved in efficiency due to the magnetic field of the magnet 11.

FIG. 2 shows the construction of a typical bucket-type ion source. The difference between this ion source and the one shown in FIG. 1 is as follows.

The bucket-type ion source shown in FIG. 2 is not equipped with an anode 5 and the anode of an arc power source 12 is directly connected to the cubic body 1. The cubic body 1 functions as the anode, and the anode of an accelerating power source 14 is connected directly or via a resistor to first electrodes 8 of the group of electrodes 7 with an insulator 17 positioned between electrodes 8 and body 1. Further, the permanent magnet 11 is composed of a plurality of annular bodies and disposed in such a manner as to form a cusp magnetic field. The ion source of FIG. 2 functions substantially similar to that of the ion source of FIG. 1.

A conventional hollow cathode type ion source is constructed as shown in FIG. 3. The difference between this ion source and that shown in FIG. 2 is as follows.

The ion source shown in FIG. 3 is not equipped with a filament 3 but has a cubic cathode body 19 made of non-magnetic metal fitted via an insulator 18 to the left-hand side opening of the cubic body 1, whereas a lid 21 made of non-magnetic metal is fitted via an insulator 20 to the left-hand side opening of the cubic body 19 so as to form a cathode chamber 22.

The cathode chamber 22 is provided with a hollow cathode 23, a heater coil 25 being wound on the outer periphery of a cylindrical body 24 incorporated in the lid 21. A thermion emitting material 26 is provided on the inner side of the cylindrical body 24 to form the hollow cathode 23. The heater coil 25 is heated by the power source 4 and the thermion emitting material 26 is heated via the cylindrical body 24.

The lid 21 is provided with a gas inlet 27 for guiding the gas into the cylindrical body 24.

The cathode of the arc power source 12 is connected to the lid 21, i.e., the cylindrical body 24 and also connected via a resistor 13 to the cubic cathode body 19 and the first electrodes 8.

Ionizing gas is introduced from the inlet 6 into the plasma generating chamber 2 and rare gas, such as argon for hollow-discharging, is introduced from an inlet 27 inside the cylindrical body 24. As the power source is activated, a discharge is caused between the cubic body 1 forming the anode and the hollow cathode 23. Rare gas hollow-discharging is generated in the inner space of the cylindrical body 24 and thermions e' are discharged from the thermion emitting material 26 because of the thermions e' thus emitted are introduced by the anode voltage into the generating chamber 2.

As a result, plasma 16 is generated in the plasma generating chamber 2 because of the discharge between the cubic body 1 and the hollow cathode 23. The discharge is made to continue by the thermions e, supplied from the cathode 23 and, as in the case of FIG. 2, the ionized gas from the gas inlet 6 is electrolytically dissociated, so that ion beams are led out via the group of electrodes.

The conventional ion source as shown in FIGS. 1 and 2 is designed to emit thermions e, required to generate plasma 16 by maintaining the filament 3 as an electron emitting source at high temperatures and simultaneously making use of the thermion emitting phenomenon. As a result, the material of the filament 3 heated to high temperatures evaporates and, while it is exposed to severe conditions such as sputtering derived from ion impacts, quickly wears. When the argon ionizing gas is employed, a tungsten filament and a lanthanum boride filament will last for approximately 50 and 100 hours, respectively. In addition to this problem, if a reactive ionizing gas, such as oxygen, is used the filament 3 will be quickly oxidized and therefore have a very short lifetime.

In the case of the ion source shown in FIG. 3, the hollow discharge resulting in thermion emission is created in the cathode chamber 22, which is different from the plasma generating chamber to which the ionizing gas is supplied. The ion source of the type shown in FIG. 3 can thus be used for longer periods than those shown in FIGS. 1 and 2. However, the thermion emitting material 26 will still be subjected to sputtering resulting from ion impacts at high temperatures even where the ionizing gas is a rare gas, such as argon, and the lifetime of the material 26 will be only for 100–200 hours.

In addition, since part of the ionizing gas introduced into the plasma generating chamber 2 is allowed to flow into the cathode chamber 22, the thermion emitting material 26 is consumed more quickly in case that the ionizing gas is an oxygen gas and the like rather than a rare gas.

Further, the hollow-discharging rare gas in the cylindrical body 24 is mixed with the ionizing gas in the plasma generating chamber 2. Consequently, the plasma 16 thus generated becomes a mixed one, comprising the ionizing gas and the hollow-discharging rare gas. Plasma generation relying on only the ionizing gas cannot be attained and the desired ion beams may become unavailable.

SUMMARY OF THE INVENTION

In view of the foregoing problems, an object of the present invention is to provide an ion source capable of generating electrons necessary for generating ionizing gas plasma without utilizing a thermion emitting phenomenon resulting from consumable material, thereby obviating the wear problem of the electron emitting material and providing a long life for the generation of an ion beam of good quality composed only of ionizing gas.

In order to solve the foregoing problems, an ion source according to the present invention comprises a main plasma chamber for generating ion beams by means of d.c. discharge and an auxiliary plasma chamber as an electron emitting source for generating plasma by high-frequency discharge and supplying electrons necessary for the d.c. discharge to the main plasma chamber.

In the ion source thus constructed, plasma is generated by high-frequency discharge in the auxiliary plasma chamber and electrons necessary for plasma generation, i.e., ionizing gas plasma generation in the main plasma chamber are generated and supplied to the main plasma chamber. As a result, the electron emitting source may be usable for a long period of time because it is unnecessary to use a filament and a thermion emitting material which are maintained at high temperatures and therefore extremely consumable.

When the same gas used for plasma generation in e the auxiliary plasma chamber is used as the ionizing gas in the main plasma chamber, moreover, the plasma in the main plasma chamber is composed only by the desired gas, so that an ion beam of good quality is formed.

DETAILED DESCRIPTION OF THE INVENTION

Figure 1:
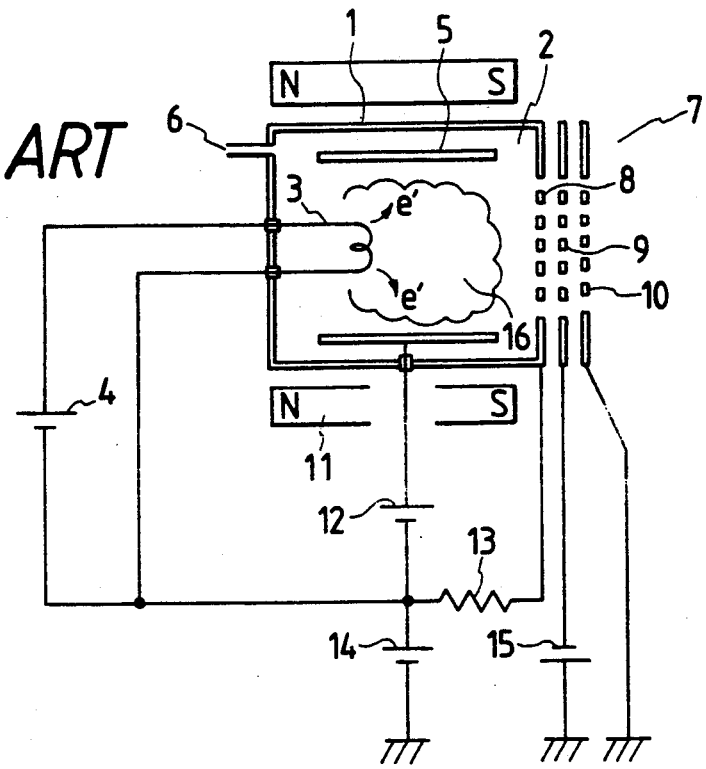
FIGS. 1 to 3 are block diagrams of a conventional ion source.
Figure 2:
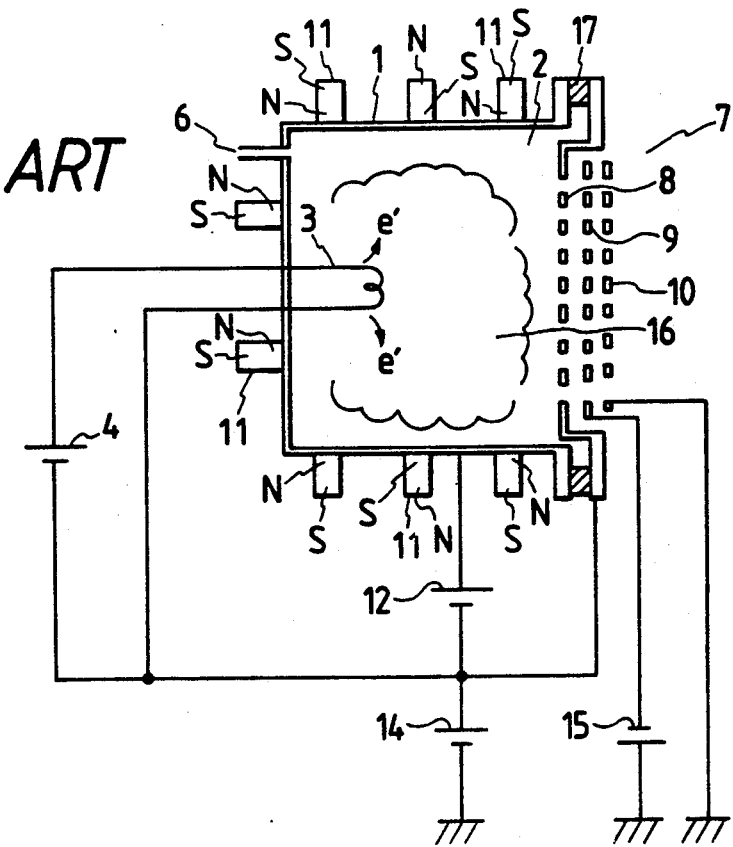

Throughout the drawings, like reference numerals designate like or corresponding parts.

Embodiment 1

Figure 4:
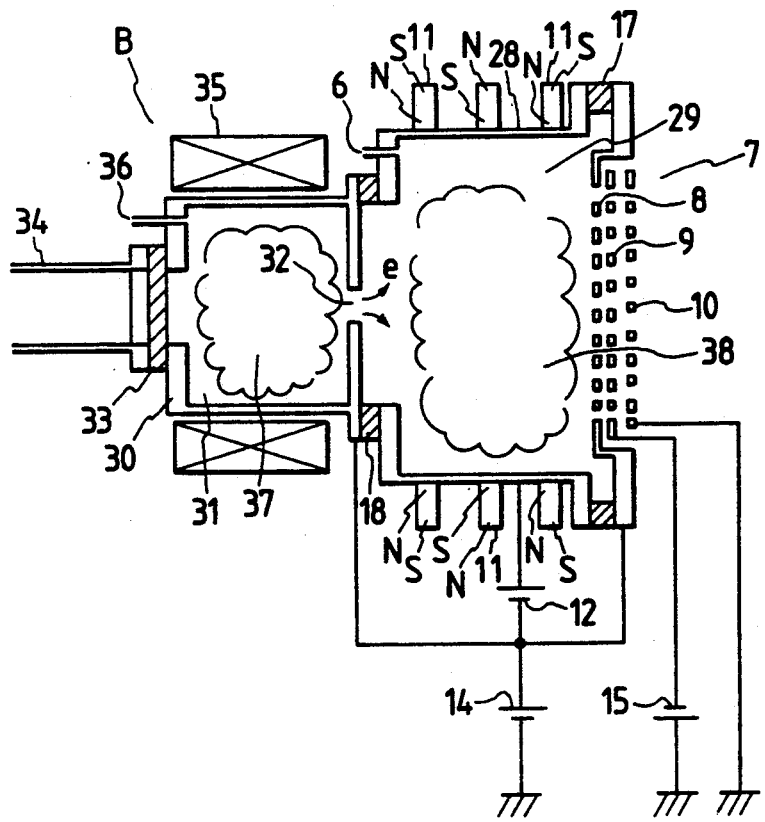
FIGS. 4 to 9 block diagrams of ion sources representing respective embodiments 1 to 6 of the present invention.

With reference to FIG. 4, a bucket-type ion source as an embodiment 1 of the present invention will be described.

Figure 3:
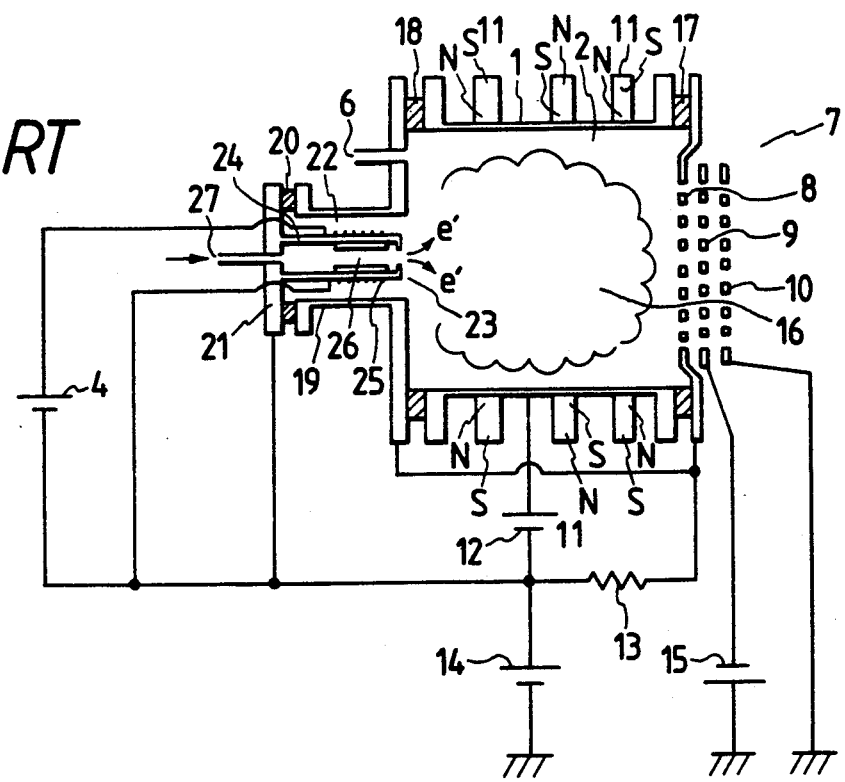

As shown in FIG. 4, the ion source utilizes microwave discharge as high-frequency discharge, wherein a main nonmagnetic metal cubic body 28 corresponding in construction to a cubic body 1 of FIG. 3 is formed into a main plasma chamber 29, whereas an auxiliary nonmagnetic metal cubic body 30 fitted via an insulator 18 to the left-hand side opening of the main cubic body 28 is formed into an auxiliary plasma chamber 31. An electron emitting port 32 is formed between the main and auxiliary plasma chambers 29, 31.

The left-hand side opening of the auxiliary cubic body 30 is blocked by an insulator 33, and a waveguide 34 connected to the insulator 33 supplies microwaves as high-frequency waves via the insulator 33 to the auxiliary plasma chamber 31.

An electromagnetic coil 35 for generating a magnetic field is provided on the outer periphery of the auxiliary cubic body 30 to cause a magnetic field exceeding Electron cyclotron resonant (ECR) conditions to exist in the auxiliary plasma chamber 31. A gas inlet 36 is formed in the auxiliary cubic body 30.

The cathode of an arc source 12 is connected to the auxiliary cubic body 30 and first electrodes 8.

The auxiliary plasma chamber 31 has dimensions and a shape so as to conform to a microwave hollow resonator and is made to readily induce microwave discharge; it is 10 cm in inner diameter and 8.7 cm long in a $TE_{111}$ mode at a microwave frequency of 2.45 GHz.

When the microwave is introduced by the waveguide 34 into the auxiliary plasma chamber, microwave discharge is generated in the auxiliary chamber 31 and an electron emitting gas, such as a rare gas, introduced from the inlet 36 into the auxiliary plasma chamber 31 is ionized and a subplasma 37 is generated. The subplasma is projected from the electron emitting port 32 toward the main plasma chamber 29. With the generation of the subplasma 37, the electrons thus ionized and generated are emitted toward the main plasma chamber because of an anode potential 40–120 V from the subplasma plane projected from the electron emitting port 32. The electron emitting port 32 is provided to regulate the gas pressure in the auxiliary plasma chamber 31. In other words, the gas pressure in the auxiliary plasma chamber is set on the order of $10^{-3}$–$10^{-2}$ torrs, irrespective of the gas pressure on the main plasma chamber side. The subplasma 37 generated by applying a magnetic field exceeding the ECR condition of the electromagnetic coil 35 becomes high-density plasma, whereby electrons e are supplied to the main plasma chamber 29 with high efficiency.

In the main plasma chamber 29, ionizing gas, such as a rare gas introduced from the inlet 6, is ionized so that a main plasma 38 is generated. Electrons e accelerated between the subplasma and the main plasma are thus supplied to make discharging continue.

Ions in the form of ion beams are drawn from the main plasma 38 by the beam drawing action of a group of electrodes 7 into a sputtering chamber, etc.

On the other hand, the main plasma is efficiently enclosed because of the cusp magnetic field of a magnet 11, so that uniform, stable main plasma 38 is generated over a large area in the vicinity of the group of electrodes 7.

The gas introduced into the auxiliary plasma chamber 31 may be any gas other than rare gas without hindrance and the same gas as the ionizing gas in the main plasma chamber 29 may be introduced into the auxiliary plasma chamber 31.

Moreover, a permanent magnet in place of the electromagnetic coil 35 may be employed. Moreover, the electromagnetic coil 35 or otherwise permanent magnet can be dispensed with.

Embodiment 2

Figure 5:
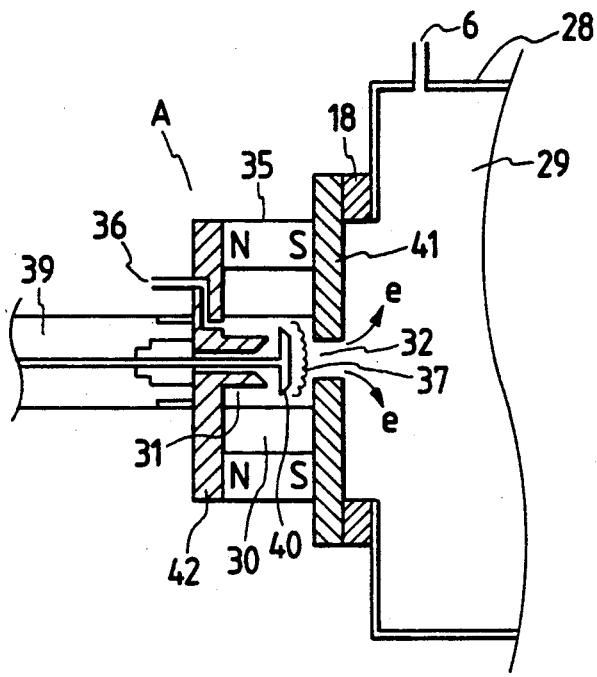

Referring to FIG. 5, a second embodiment of the present invention will be described.

As shown in FIG. 5, microwaves are introduced via a coaxial cable 39 and an antenna 40 into the auxiliary plasma chamber 31 of FIG. 4. Lids 41, 42 made of magnetic or nonmagnetic material are fitted to the right- and left-hand openings of the auxiliary cubic body 30, respectively. The lid 41 on the right-hand side is fitted via the insulator 18 to the main cubic body 28, whereas the electron emitting port 32 is formed in the lid 41 on the right-hand side.

The antenna 40 provided in the auxiliary plasma chamber 31 is passed through the left-hand side lid 42 and connected to the coaxial cable 39. The gas inlet 36 is formed in the auxiliary plasma chamber 31 and a permanent magnet 35 is provided on the outer periphery of the auxiliary cubic body 30 to cause a magnetic field exceeding the ECR condition to be generated in the auxiliary plasma chamber 31.

The tip of the antenna 40 is provided close to the wall of the auxiliary plasma chamber 31 in order for microwave discharge to be readily induced.

When a microwave is introduced via the cable 39 and the antenna 40 into the auxiliary plasma chamber 31, microwave discharge is readily produced because of the high electric field between the tip of the antenna 40 and the auxiliary plasma chamber 31 even though the auxiliary plasma chamber 31 has not been formed under the microwave hollow resonator condition.

When the microwave discharge is generated, the gas introduced from the inlet 36 into the auxiliary plasma chamber 31 is ionized and caused to generate the subplasma 37. Electrons e are thus supplied from the electron emitting port 32 to the main plasma chamber 29.

Since the coaxial cable 39 and the antenna 40 are used in this case, the auxiliary plasma chamber 31 is not restricted by the microwave hollow resonator condition. Consequently, the auxiliary plasma chamber 31 can be made compact.

The emitted electron quantity can also be increased by increasing the number of antennas 40. The main body chamber and other parts not shown are the same as in FIG. 4.

The magnet 35 may be an electromagnet and can be made smaller in size if the lids 41, 42 are made of magnetic material.

Moreover, the permanent magnet 35 or otherwise electromagnet can be dispensed with.

Embodiment 3

Figure 6:
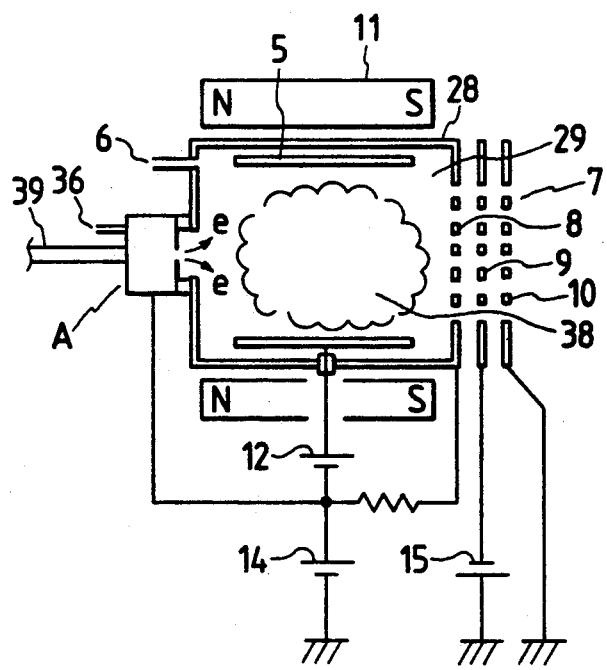

FIG. 6 shows an embodiment 3 wherein a means A for generating the subplasma 37 of FIG. 5 was applied to the Kaufman-type ion source.

The ion source shown in FIG. 6 was tested using a microwave of 2.45 GHz, 20 W. The microwave discharge current became 2A and argon ion beams were drawn out stably at a beam current of 100 mA with a group of porous electrodes 7 having a drawing caliber of 2.5 cm$\theta$. A means B for generating the subplasma, as in FIG. 4, may be used with a Kaufman-type ion source.

Embodiment 4

Figure 7:
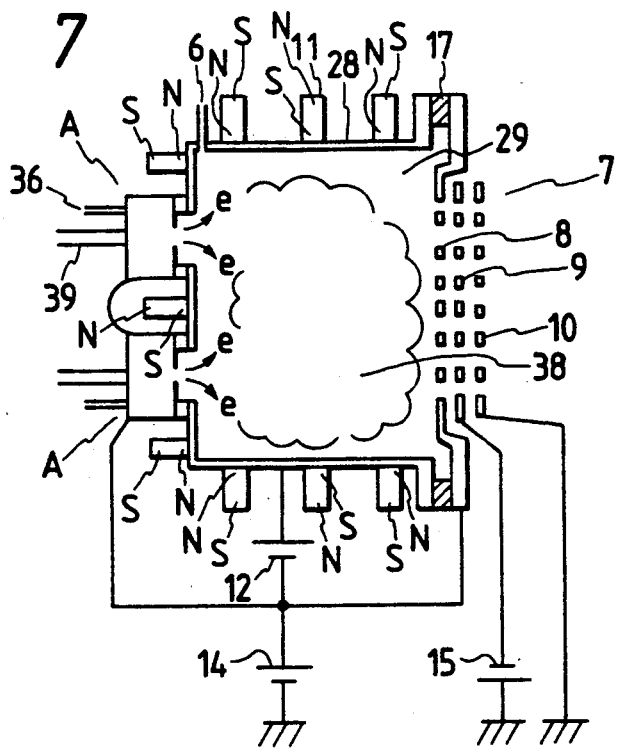

FIG. 7 shows an embodiment 4 wherein two sets of a means A for generating the subplasma 37 of FIG. 5 were applied to the bucket-type ion source.

In this case, electrons e are supplied from two of the generating means A, i.e., two of the auxiliary plasma chambers 31 to the main plasma chamber 29. As a result, the supply of electron quantity increases to the extent that it is effective as a large-sized ion source. More than three generating means A may be employed.

A plurality of means A or B for generating the subplasma 37 may be applicable to a Kaufman-type ion source or a bucket-type ion source. When a plurality of generating means A, B are employed, the quantity of electrons emitted from each of the generating means A, B can be adjusted by controlling individual microwave power.

Embodiment 5

Figure 8:
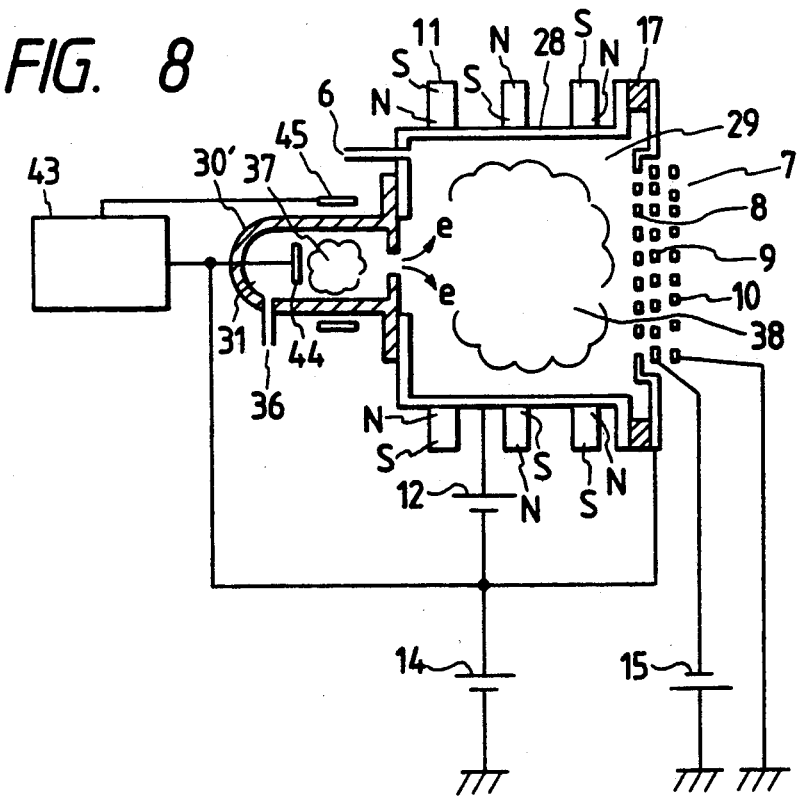

Embodiment 5 shown in FIG. 8 indicates an example of generating high-frequency discharge at a frequency lower than that of microwave frequencies.

FIG. 8 refers to a bucket-type ion source wherein an auxiliary cubic body 30' is made of heat resistant glass and the electron emitting port 32 of the auxiliary cubic body 30' communicates with the main plasma chamber 29. A pair of high-frequency electrodes 44, 45 are connected to a high-frequency power source 43 for producing high-frequency voltage on the order of MHz. A plate-like electrode 44 on one side is provided in the auxiliary plasma chamber 31, whereas a cylindrical electrode 45 on the other is provided in the auxiliary cubic body 30'.

High-frequency discharge is caused by the high-frequency power source 43 to generate between both electrodes 44, 45 and, as in the case of microwaves, subplasma is generated in the auxiliary plasma chamber 31. Electrons are emitted and supplied from the auxiliary plasma chamber 31 to the main plasma chamber 29.

In this case, the whole system becomes less costly because the high-frequency power source 43 is less expensive than a microwave generator.

Moreover, the density of the subplasma can be increased by providing a permanent magnet or electromagnetic coil for generating a magnetic field on the exterior of the auxiliary plasma chamber 31. This embodiment is also applicable to the Kaufman-type ion source.

Embodiment 6

Figure 9:
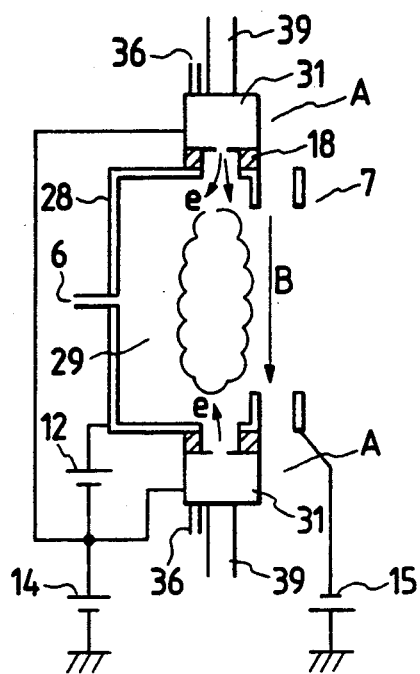

FIG. 9 shows a case as an embodiment 6 wherein the means A for generating the subplasma 37 of FIG. 5 is applied to a Freeman-type ion source.

In this ion source, the arc power source 12 is used to apply d.c. voltage between the auxiliary plasma chamber 31 and the main cubic body 28 simultaneously used as the anode to have electrons emitted from the auxiliary plasma chamber, whereby the main plasma is generated. In the main plasma chamber 29, the axial magnetic field can be formed by a magnetic field generating means (not shown) at this time.

Ions in the main plasma can be drawn out with desired energy from the slit-like ion drawing unit provided at one end of the main cubic body 28.

A description will subsequently be given of the results of examinations made on whether the drawn-out quantity of electrons can be increased by providing electron drawing electrodes between the auxiliary and main plasma chambers to improve the performance of the ion source according to the present invention.

Figure 10:
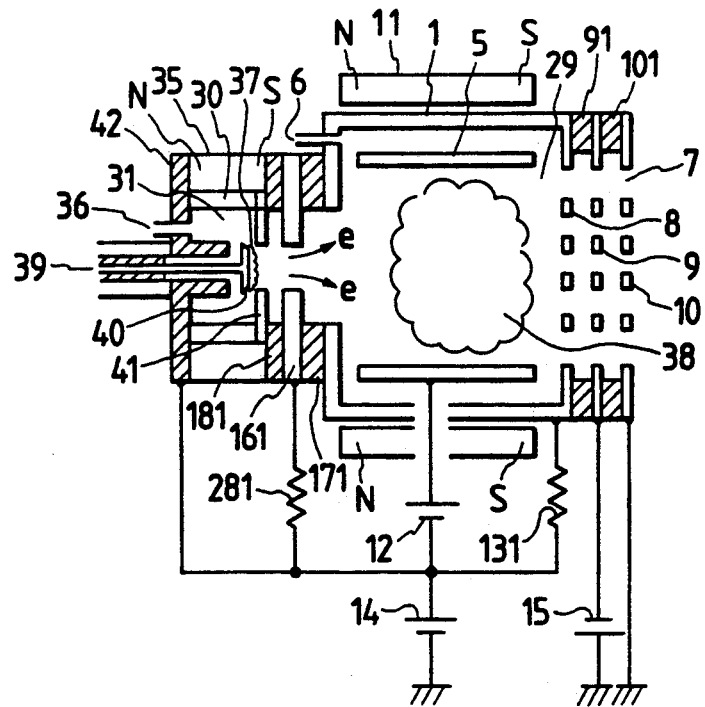
FIG. 10 is a block diagram of an ion source having an auxiliary plasma chamber equipped with an electron drawing electrode.

FIG. 10 refers to a case where the auxiliary plasma chamber is provided with electron drawing electrodes 161. The electron drawing electrodes 161 are provided between the auxiliary plasma chamber 31 and the main plasma chamber 29 via insulators 171, 181 and electrically connected via a resistor 281 to the cathode of the arc source 12. Gas is supplied from the gas inlet 36 and the subplasma 37 is generated when microwaves are introduced via the antenna 40 into the auxiliary plasma chamber 31. Subsequently, the arc power source 12 is used to apply a d.c. voltage of 50-200 V between the auxiliary plasma chamber 31 and the main plasma chamber 29. Electrons e ionized by the generation of the subplasma 37 are drawn into the main plasma chamber 29 to form the main plasma 38. At this time, the potential of each electron drawing electrode 161 is at a floating potential which is higher than the cathode potential and lower than the anode voltage in conformity with the difference in potential between the subplasma 37 and the main plasma 38 as it is connected via a resistor 281. When a d.c. power source instead of the resistor 281 is connected to the electron drawing electrodes 161, the electron draw-out potential is determined by the voltage of the power source.

Figure 11:
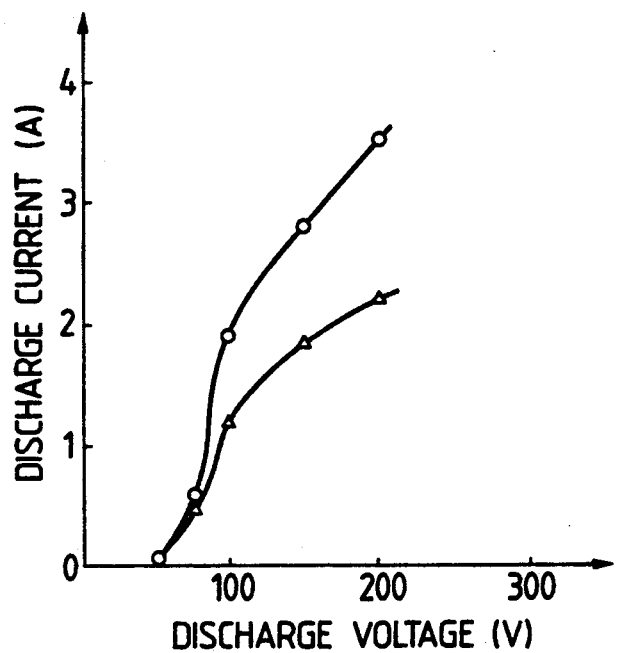
FIG. 11 is a graph illustrating the relation between discharge voltage and discharge current.
Figure 12:
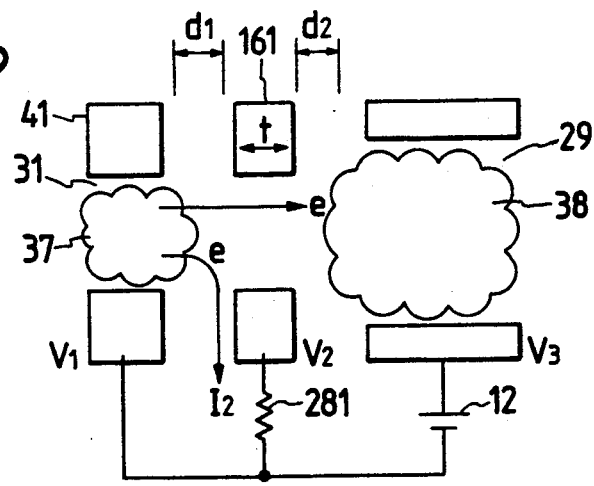
FIG. 12 is a typical block diagram of the electron drawing unit of the ion source of FIG. 10 with respective potential.
Figure 12:
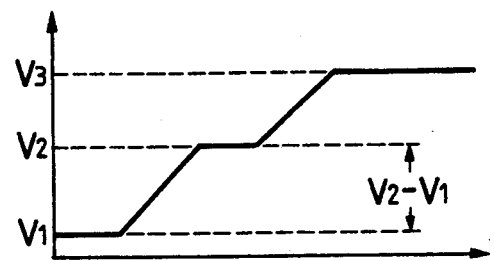
Figure 13:
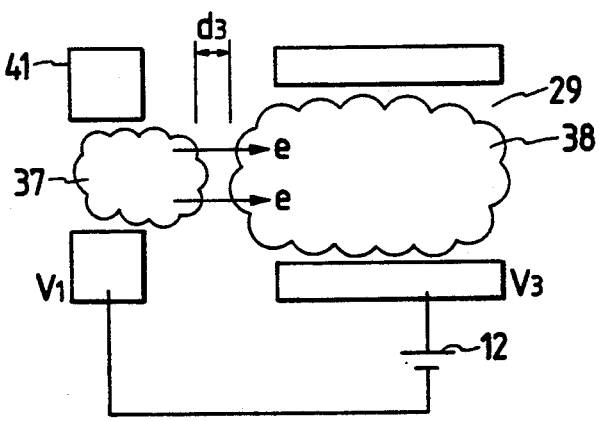
FIG. 13 is a typical block diagram of the electron drawing unit of the ion source of FIG. 10 with respective potential, the ion source being provided with no electron drawing electrode.
Figure 13:
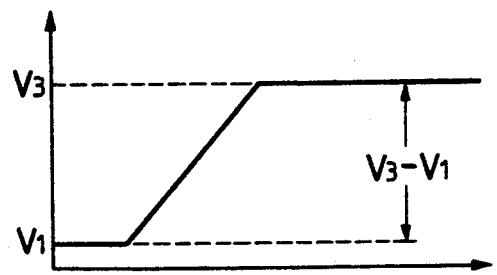

FIG. 11 is a graph illustrating test results obtained when argon was used as the discharge gas to verify the effect of providing the electron drawing electrodes 161. FIG. 11 indicates the results of actual measurement of discharge current versus discharge voltage in the main plasma chamber 29 on the basis of the voltage of the arc source 12. The resistance of resistor 281 and of FIG. 10 was 500 Ω. The line represented by symbols Δ is for the case where the electron drawing electrodes are used, whereas the characteristics of the system without the provision of the electron drawing electrodes are represented by symbol o. The potential of the electron drawing electrodes 161 was held substantially constant at 60 V more negative than the anode potential, which was within the range of 100-200 V. According to the test results shown in FIG. 11, the emitted quantity of electrons was seen to unexpectedly decrease by the provision of the electron drawing electrodes 161. The reason for this is considered attributable to the following: FIG. 12 is a schematic example of the electron drawing unit, including the electron drawing electrodes 161 of FIG. 10, with the potential values shown below the schematic. FIG. 13 is a schematic example of the electron drawing unit where no electron drawing electrodes are provided. As shown in FIG. 13, when no electron drawing electrodes are provided, the potential $V_1$ of the subplasma differs from that $V_3$ of the main plasma and a sheath is formed at the interface where portions of the auxiliary plasma and main plasma come in contact with one another. Each electron ionized and generated in the auxiliary plasma chamber 31 obtains energy corresponding to the potential difference $(V_3-V_1)$ as it passes the sheath (by distance $d_3$) and is emitted to the main plasma chamber 29. When the electron drawing electrodes 161 are inserted in between the subplasma 37 and the main plasma 38, on the other hand, there are formed two sheaths $d_1$ and $d_2$. Because of the thickness t of the electrode, an electron generated in the auxiliary plasma chamber has ultimately to cover a distance of $d_1+d_2+t$. The quantity of electrons emitted from the auxiliary plasma chamber 31 relies upon the distance in which the electron is accelerated by the potential difference $(V_3-V_1)$ of the plasmas. Since $d_1+dz_2+t>d_3$, the emitted quantity of electrons without the installation of the electron drawing electrodes appears to have increased, compared with the case where the electron drawing electrodes have been inserted. In addition, the drawing electrodes 161 are at a positive voltage relative to that of the auxiliary plasma chamber 31 so that some of the electrons directed from the subplasma 37 to the main plasma 38 are allowed to flow into the electrodes. The quantity of electrons emitted into the main plasma chamber 29 accordingly decreases.

As set forth above, the ion source according to the present invention has proved that it is capable of emitting electrons at a large current simply without the necessity of electron drawing electrodes. In addition to the effect of reducing cost and size of the system by simplifying its construction, the reliability of the system is improved by the elimination of insulators 171, 181 on both sides of the electron drawing electrodes.

As the present invention is arranged as shown in reference with the embodiments 1 through 6, the following effects are attained:

The subplasma 37 is generated by the high-frequency discharge in the auxiliary plasma chamber 31 as an electron emitting source and electrons e necessary for the generation of plasma in the main plasma chamber 29 are generated before being supplied to the main plasma chamber 29. It consequently becomes possible for the ion source to be continuously operated for several hundred hours without causing the material to wear while prolonging the life of the electron emitting source as compared with a case where consumable material such as thermion emitting material is heated up to and maintained at high temperatures to utilize the thermion emission phenomenon.

Since any gas other than rare gas is usable for the generation of the subplasma 37 in the auxiliary plasma chamber 31, moreover, selection of gas for use is not restricted. When the same gas as that ionized in the main plasma chamber 29 is utilized for the auxiliary plasma chamber 31, the main plasma 38 in the main plasma chamber 29 becomes the desired ionized gas, whereby ion beams of good quality can be formed.

In the case of reactive gas such as oxygen gas, the plasma generation can be maintained stably for a long period of time without wear resulting from oxidation.

Additional embodiments of the present invention will be described with reference to FIGS. 14 to 25.

In these drawings, like reference characters designate like and corresponding parts shown in FIGS. 1 through 13.

Embodiment 7

Figure 14:
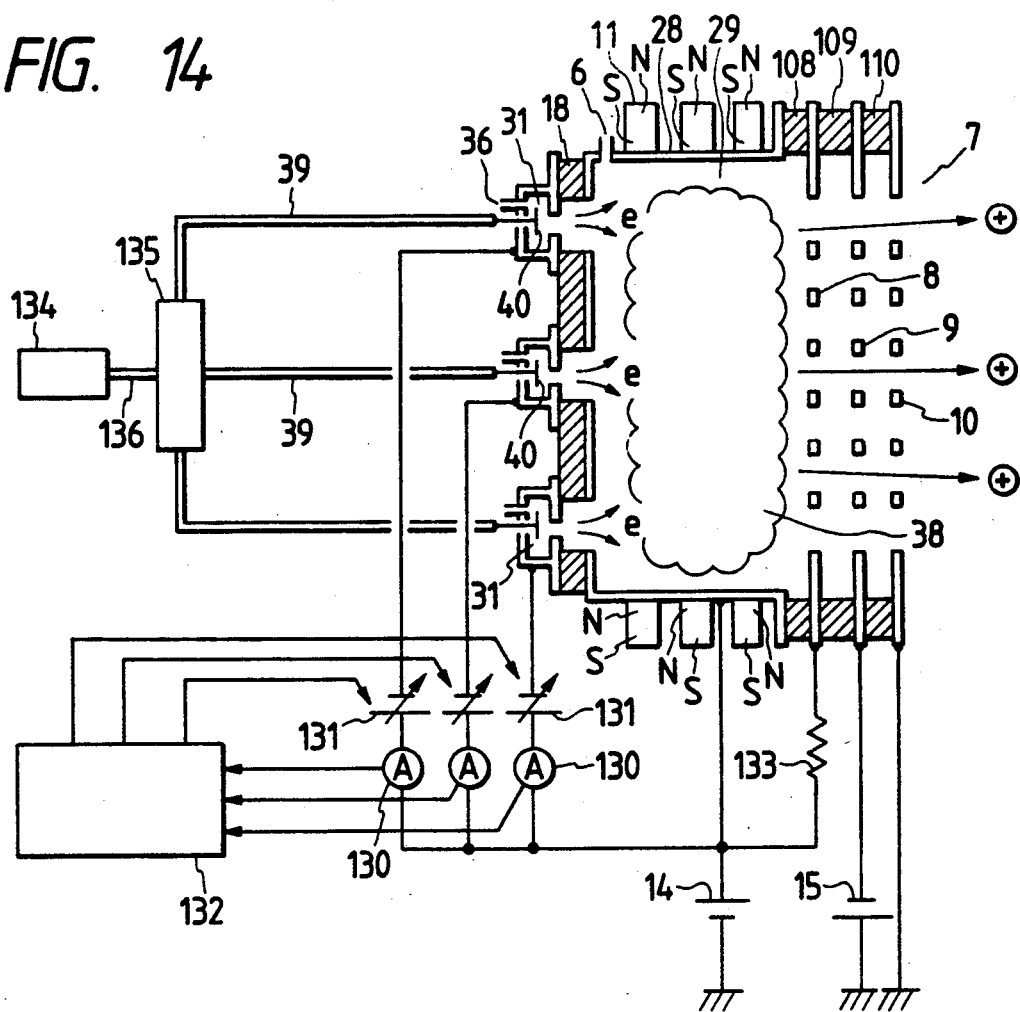
FIGS. 14 and 15 are a block diagram of an ion source as an embodiment 7 of the present invention and a characteristic drawing of emitted electron quantity.
Figure 15:
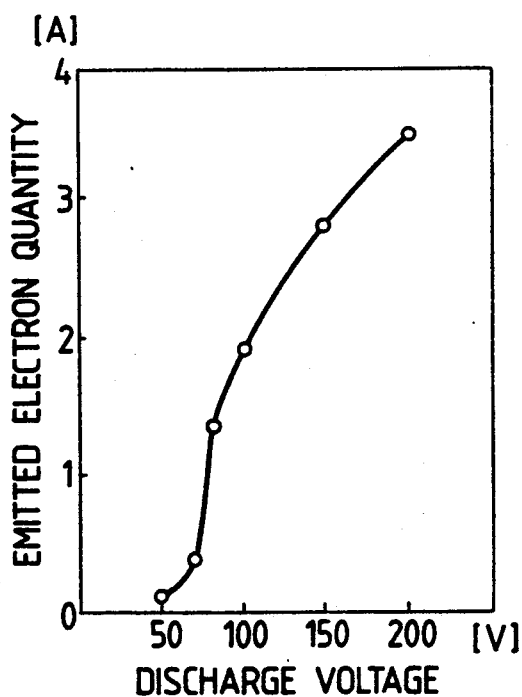

Referring to FIGS. 14 and 15, an embodiment 7 will be described.

There are shown therein three type A (FIG. 5) auxiliary plasma chambers 31, each having an antenna 40. Lids are provided as both sides of the auxiliary cubic body and a permanent magnet or electromagnet is installed outside thereof as shown in detail in FIG. 5.

The gas inlets 36 are used to supply gas to the auxiliary plasma chambers 31, and current detectors 130 are provided in a cathode current channel between the main cubic body 28 and the auxiliary cubic body of each auxiliary plasma chamber 31. Variable d.c. power sources 131 are connected to each current detector 130 in series and are equivalent in function to the arc source 12 of FIG. 4. A control unit 132 is composed of a microcomputer for automatically controlling each variable d.c. power source 131 in conformity with the value detected by the detector 130.

Also included are a current limiting resistor 133 provided between the main cubic body 28 and the first electrodes 8, a microwave power source 134, a branch circuit 135 for dividing the microwave power of the power source 134, a coaxial cable or wave guide 136 between the microwave power source 134 and the branch circuit 135 and a coaxial cable 39 between the branch circuit 135 and each antenna 40.

Electrons e are emitted from each auxiliary plasma chamber 31 to the main plasma chamber 29 as a result of microwave discharge based on the microwaves introduced from each antenna 40 to the corresponding auxiliary plasma chamber 31 via the microwave power source 134 and the branch circuit 135.

The potential (cathode potential) of each auxiliary plasma chamber 31 with respect to the potential (anode potential) of the main plasma chamber 29 is individually set by each variable d.c. power source 131. The quantity of electrons emitted from each auxiliary plasma chamber 31 changes as shown in FIG. 15 because of the d.c. bias voltage (discharge voltage) between the main plasma chamber 29 and each auxiliary plasma chamber 31.

The voltage of each variable d.c. power source 131 causes the cathode current of each auxiliary plasma chamber 31 which flows through each variable d.c. power source 131 and each current detector 130 to change, so that the emitted quantity of electrons in each auxiliary plasma chamber 31 is directly measured and accurately detected, though it varies with the quantity of input microwaves, gas pressure or the like.

On the basis of the value detected by each current detector 130, the control unit 132 regulates the voltage of each variable d.c. power source 131 with the set cathode current value of each auxiliary plasma chamber 31 as a reference when, for instance, the density distribution of the main plasma 38 is uniform in order to automatically regulate the cathode current of each auxiliary plasma chamber 31.

The density of electrons e emitted from each auxiliary plasma chamber 31 to the main plasma chamber 29 is accordingly prevented from varying and the density distribution of the main plasma 38 is made uniform. As a result, large current uniform ion beams are available.

Since the quantity of input microwaves in the auxiliary plasma chamber 31 is not adjusted, the microwave power source 134 need not be equipped with a microwave regulator, whereby the whole system can be made smaller in construction. Numerals (108), 109, 110 designate insulators provided between the main cubic body 28 and their respective electrodes 8, 9, 10.

Embodiment 8

An embodiment 8 will subsequently be described with reference to FIG. 16.

Figure 16:
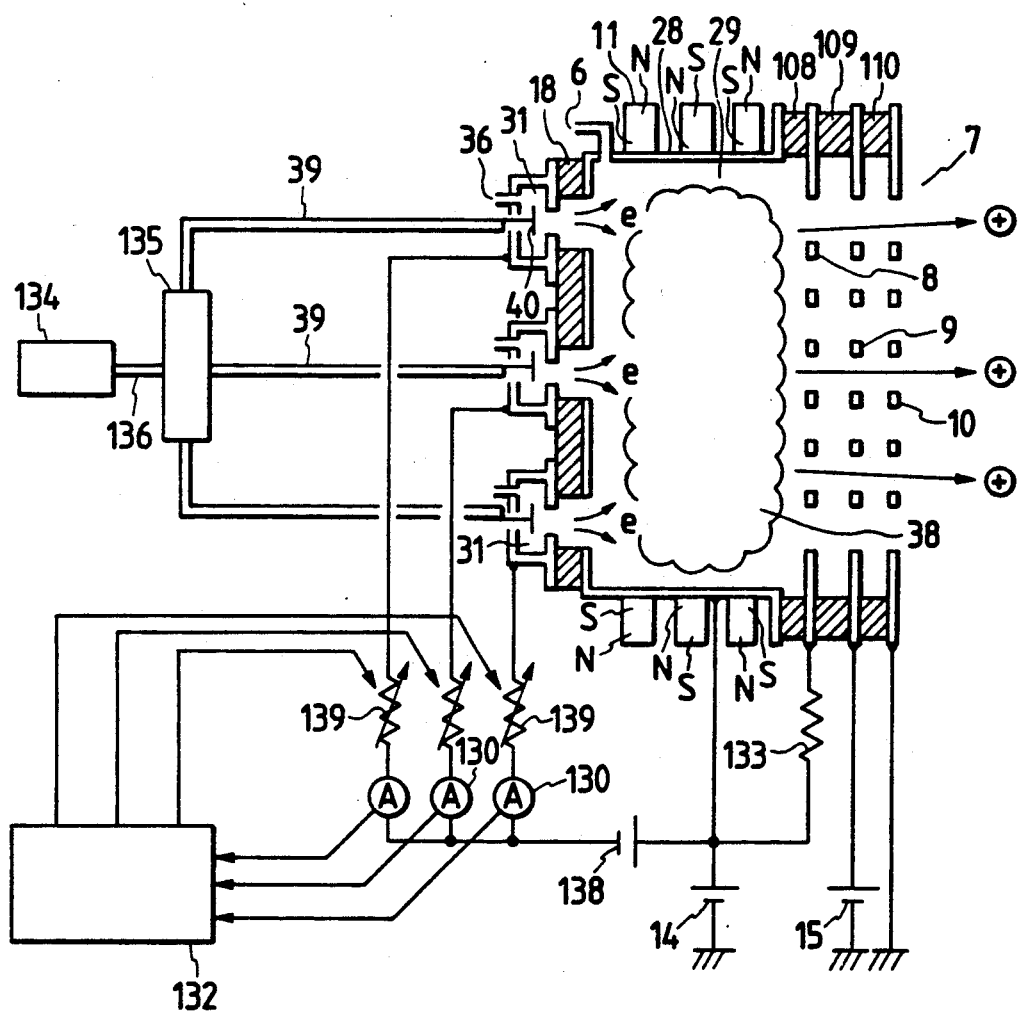
FIG. 16 is a block diagram of an ion source as an embodiment 8 of the present invention.

FIG. 16 differs from FIG. 14 in that FIG. 16 includes an arc source 138, provided between the main cubic body 28 and each current detector 130, and variable resistors 139 in place of the variable d.c. power sources 131 of FIG. 14, as current regulators.

On the basis of the value detected by each current detector 130, each variable resistor 139 is regulated and the cathode current of each auxiliary plasma chamber 31 is automatically regulated. The density distribution of the main plasma 38 is made uniform. As a result, large currents of uniform ion beams are available.

Since the number of d.c. power sources in FIG. 16 is smaller than that in the case of FIG. 14, the system as a whole can be made less costly, extremely compact and lightweight.

Although the coaxial cable and the antenna have been employed to supply microwaves to each auxiliary plasma chamber 31 in both the preceding embodiments, use can be made of waveguides.

Moreover, one or more than one antenna may be used for each auxiliary plasma chamber 31.

On the basis of the value detected by each current detector 130, each variable value power source 131 or variable resistor 139 may be adjusted manually.

The present invention is also applicable to the Kaufman-type ion source.

Since the embodiments 7 and 8 are thus constituted, the following effects are ensured:

As there are provided a plurality of auxiliary plasma chambers 31, each current detector 130 is employed to detect the cathode current. In other words, the quantity of electrons emitted from each auxiliary plasma chamber 31 to the main plasma chamber is directly measured and detected. As a result, the value thus detected is accurate and, on the basis of the value detected by each detector 130, the cathode current in each auxiliary plasma chamber 31 is regulated by the current regulator such as the variable d.c. current source 131 or variable resistor 139 in each cathode current channel, whereby the quantity of electrons emitted from each auxiliary plasma chamber 31 is adjusted. As a result, the density of electrons emitted into the main plasma chamber 29 is prevented from varying with the system which is less costly and simple in construction. In addition, the density distribution of the main plasma 38 is made uniform and large current uniform ion beams are available.

Embodiment 9

An embodiment 9 will subsequently be described with reference to FIG. 17.

Figure 17:
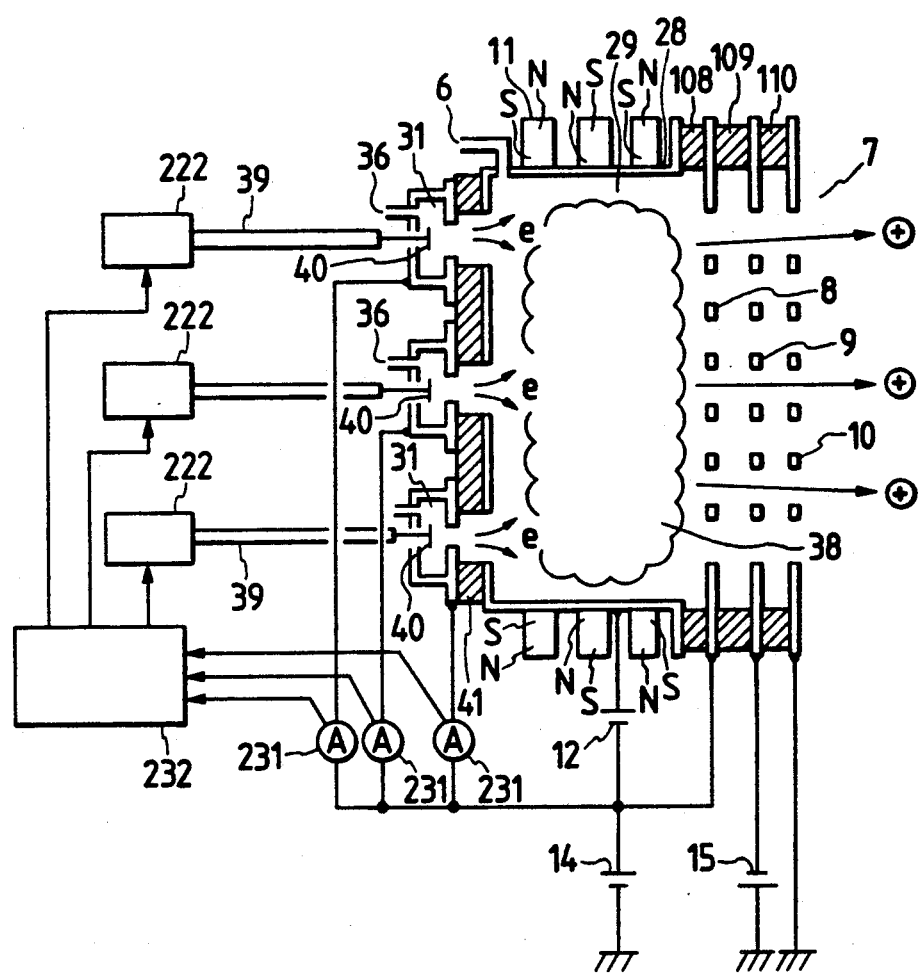
FIGS. 17 and 18 are block diagrams of ion sources as embodiments 9 and 10 of the present invention.

In FIG. 17, three type A (FIG. 5) auxiliary plasma chambers 31 are provided with their respective antennas 40, lids and permanent magnets or electromagnets as in FIG. 5.

There is shown an arrangement of inlets 36 for supplying gas to each auxiliary plasma chamber 31, coaxial cables 39 between microwave power sources 222 and each antenna 40, current detectors 231 inserted into each cathode current channel between the auxiliary cubic bodies of the auxiliary plasma chambers 31 and the cathode of arc power source 12, and a control unit 232 formed with a microcomputer for automatically regulating the microwave regulator of each microwave power source 222 in conformity with the value detected by each detector 231.

Microwave discharge based on the microwaves introduced from each antenna 40 into the auxiliary plasma chamber 31 is employed to emit individual electrons e from each auxiliary plasma chamber 31 to the main plasma chamber 29. The density distribution of electron e in the main plasma chamber 29 at this time relies upon the emitted quantity of electrons emitted from each auxiliary plasma chamber 31.

Moreover, the quantity of electrons emitted from each auxiliary plasma chamber 31 causes changes in the current following from the arc source 12 to each current detector 231 via the main cubic body 28 and the auxiliary cubic body of each auxiliary plasma chamber 31.

Consequently, the emitted quantity of electrons in each auxiliary plasma chamber 31 is directly measured and accurately detected in conformity with the value detected by each current detector, though it varies with the quantity of input microwaves, gas pressure or the like.

On the basis of the value detected by each current detector 231, the control unit 232 regulates the microwave regulator of the microwave power source 222 with the set value of the emitted quantity of electrons in each auxiliary plasma chamber 31 as a reference when, for instance, the density distribution of the main plasma 38 becomes uniform in order to automatically regulate the input quantity of microwaves in each auxiliary plasma chamber 31.

As a result, the density of electrons e emitted into the main plasma chamber 29 is prevented from varying, and the density distribution of the main plasma 38 is made uniform and large current uniform ion beams are available.

Embodiment 10

Figure 18:
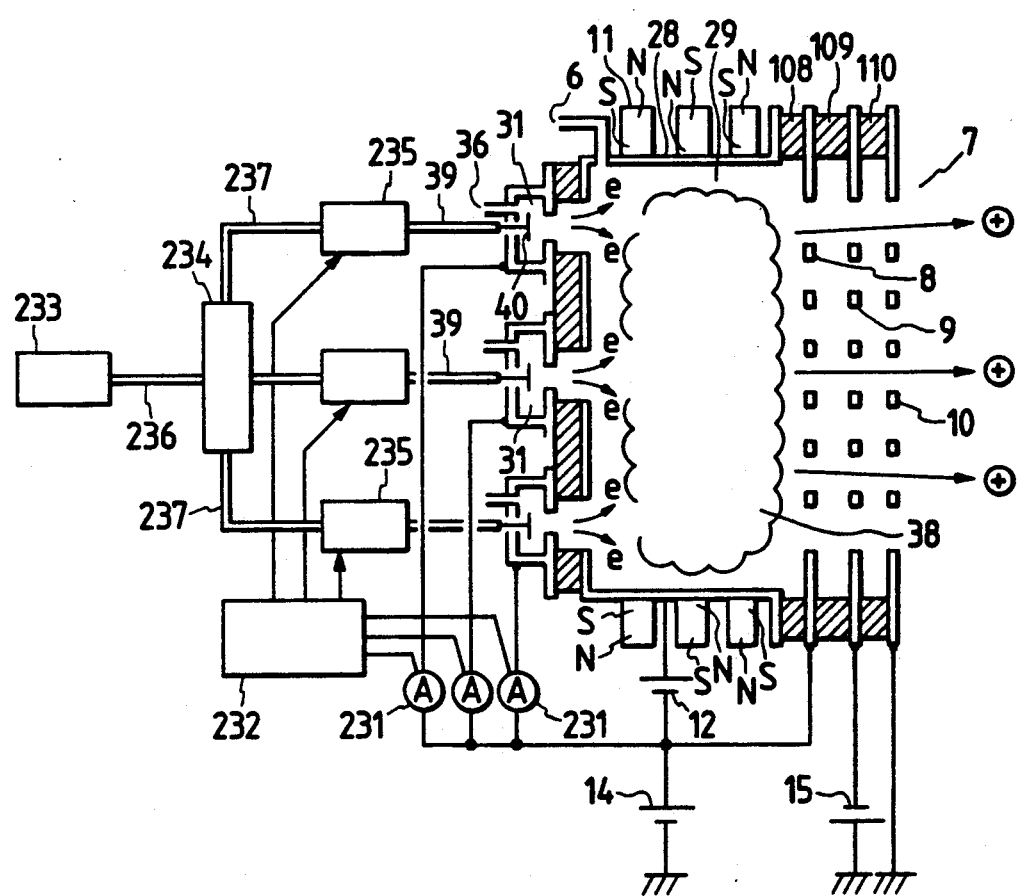

An embodiment 10 will subsequently be described with reference to FIG. 18.

This embodiment is the same as in FIG. 17 except that instead of plural controllable microwave power sources 222, it includes microwave power source 233, a branch circuit 234, and plural microwave regulators 235 such as variable attenuators.

There is also shown an arrangement of a coaxial cable or waveguide 236 between the microwave power source 233 and the branch circuit 234, a coaxial cable or waveguide 237 between the branch circuit 234 and each regulator 235, and a coaxial cable 39 between the regulator 235 and each antenna 40.

On the basis of the value detected by each current detector 231, the control unit 232 regulates each regulator 235 to exercise automatic control as in the case of FIG. 17.

In this case, microwaves are supplied by one microwave power source 233 to each auxiliary plasma chamber 31, whereby the whole system is simplified in construction and therefore made less costly.

Although the coaxial cable and the antenna have been employed to supply microwaves to each auxiliary plasma chamber 31 in both the preceding embodiments, waveguides may be used instead, i.e., type B rather than type A auxiliary plasma generators may be used. Also, the number of auxiliary chambers need not be limited to three.

Moreover, the number of antennas 40 of each auxiliary plasma chamber 31 is not limited to one but may be more than one.

On the basis of the value detected by each current detector 231, the quantity of microwaves to the auxiliary plasma chamber 31 may be adjusted manually.

The present invention is also applicable to the Kaufman-type ion source.

Since the embodiments 9 and 10 are thus constituted, the following effects are assured:

As there are provided a plurality of auxiliary plasma chambers 31, each current detector 231 is employed to detect the cathode current. In other words, the quantity of electrons emitted from each auxiliary plasma chamber 31 to the main plasma chamber is directly measured and detected. As a result, the value thus detected is accurate and, on the basis of the value detected by each detector 231, the quantity of microwaves input to each auxiliary plasma chamber 31 is regulated by the microwave regulators 222, 235, whereby the quantity of electrons emitted from each auxiliary plasma chamber 31 is adjusted. As a result, the density of electrons emitted into the main plasma chamber 29 is prevented from varying with the system which is less costly and simple in construction. In addition, the density distribution of the main plasma 38 is made uniform and large current uniform ion beams are available.

Embodiment 11

An embodiment 11 will subsequently be described with reference to FIG. 19.

Figure 19:
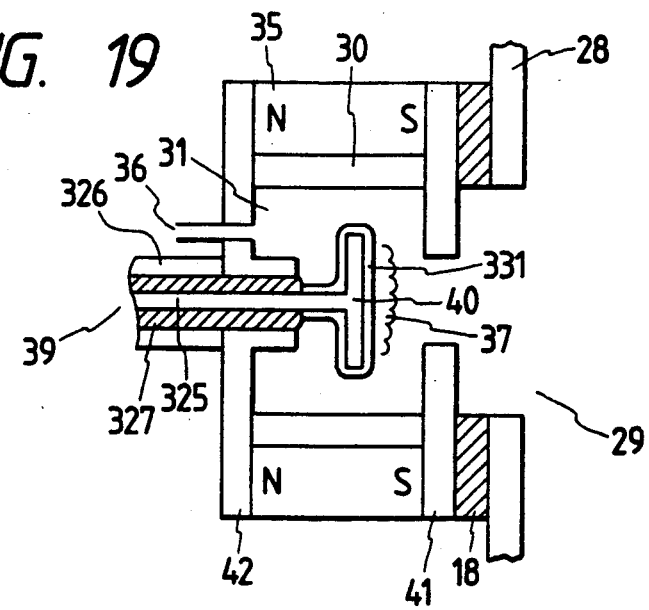
FIG. 19 is a block diagram of an ion source as an embodiment 11 of the invention.

In FIG. 19, there is shown an auxiliary plasma chamber of the type A variety, comprising a microwave antenna 40, coaxial cable 39 connected to the base of the antenna 40 and used for supplying microwaves, said coaxial cable including a central conductor 325 and a dielectric 327 provided between the central conductor 325 and a housing conductor 326. The antenna 40 is made of a conductive material whose melting point is higher than that of stainless steel. The exposed portion of the antenna 40 is covered with a protective coating 331 having a high melting point, a low sputtering coefficient and highly oxygen-resistant properties.

As the material of the antenna 40, those shown in Table 1 may be used.

The coating 331 is made of, e.g., dielectric, alloy or the like as shown in Table 2 and formed by sintering, depositing, sputtering, ion-plating or the like.

TABLE 1

| Material: | Melting point °C.: | Material: | Melting point °C.: |
|---|---|---|---|
| C (carbon) | 3,700 | Nb (niobium) | 2,500 |

TABLE 1-continued

| Material: | Melting point °C.: | Material: | Melting point °C.: |
| --- | --- | --- | --- |
| W (tungsten) | 3,000 | Zr (zirconium) | 2,127 |
| Ta (tantalum) | 3,000 | Ti (titanium) | 1,700 |

TABLE 2

| Material: | Melting point °C.: | Material: | Melting point °C.: |
| --- | --- | --- | --- |
| ZrO$_2$ (zirconium oxide) | 2,600 | TiN (titanium nitride) | 2,900 |
| TiO$_3$ (titanium oxide) | 2,100 | AlN (aluminum nitride) | 2,800 |
| Al$_2$O$_3$ (aluminum oxide) | 2,050 | TaC (tantalum carbide) | 3,800 |
| TaN (tantalum nitride) | 3,000 | ZrC (zirconium carbide) | 3,200 |
| BN (boron nitride) | 3,000 | TiC (titanium carbide) | 3,200 |
| ZrN (zirconium nitride) | 2,900 | SiC (silicon carbide) | 2,800 |

The antenna 40 and the coating 33 are resistant to temperatures higher than those to which conventional stainless steel antennas are resistant.

The present invention is also applicable to the bucket-type ion source.

Since this embodiment 11 is thus constituted, the following effects are ensured:

As the antenna of the auxiliary plasma chamber is made of conductive material having a high melting point and has the exposed portion covered with the protective coating 331 having a high melting point, a lower sputtering coefficient and highly oxygen-resistant properties, the coating as well as the antenna is resistant to high temperatures. In addition, the exposed portion of the antenna, which is readily reactive with oxygen, is protected by the coating from microwave plasma sputtering and the gas introduced. Even if oxygen gas is introduced, the antenna and the coating will wear to a minimum extent, whereas the adhesion of evaporated matter and oxides to the wall of the auxiliary plasma chamber can be minimized. Further, the limitation of the supply of microwaves is obviated, whereby a great deal of microwaves are supplied to the auxiliary plasma chamber to generate high-density plasma. The quantity of electrons emitted into the main plasma chamber is thus increased to make large current ion beams available and allow continuous operation for hours.

Embodiment 12

An embodiment 12 will subsequently be described with reference to FIG. 20.

A protective plate 428 provided between the main cubic body 38 and the insulators 18 is made of metal such as stainless steel, molybdenum or the like having a low sputtering coefficient. An opening 429 is bored in the protective plate 428 and located so as to correspond to the electron emitting port 32. The protective plate 428 is connected to the arc power source 12 via the main cubic body 28 and a resistor 413 having a high resistance.

Substantially no current is caused to flow through the protective plate 428. The potential of the protective plate 428 is based on the difference in potential between the main plasma 38 and the subplasma 37 and is controlled so that it is higher than the potential in the auxiliary plasma chamber 31 and set to float at a level lower than the potential in the main plasma chamber 29.

The potential of the protective plate 428 relative to that of the main plasma 38 ranges from 50-100 V, though it slightly varies with the discharge condition and ionizing gas, provided the discharge voltage based on the arc source 12 ranges from 100-300 V.

The protective plate 428 instead of the lid 41 is exposed to the main plasma 38 and the high energy argon ions Ar+ are caused to sputter the protective plate 428. The sputtering energy is reduced in this case as compared with a case where the lid 41 is sputtered at an energy of 100-300 V without using the protective plate and the sputtering coefficient is approximately halved. Almost no ions are emitted from the protective plate 428, so that the main plasma chamber 29 is protected from contamination.

Embodiment 13

Figure 21:
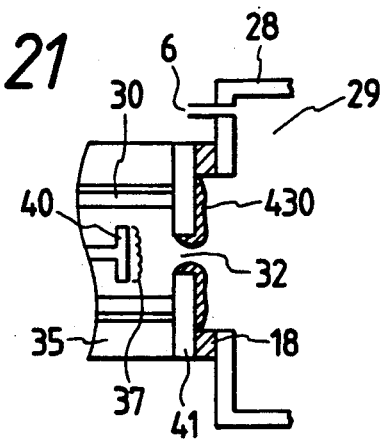

An embodiment 13 will subsequently be described with reference to FIG. 21.

A protective material 430 is composed of insulating material used to cover one side of the lid 41 facing the main plasma chamber 29.

Figure 20:
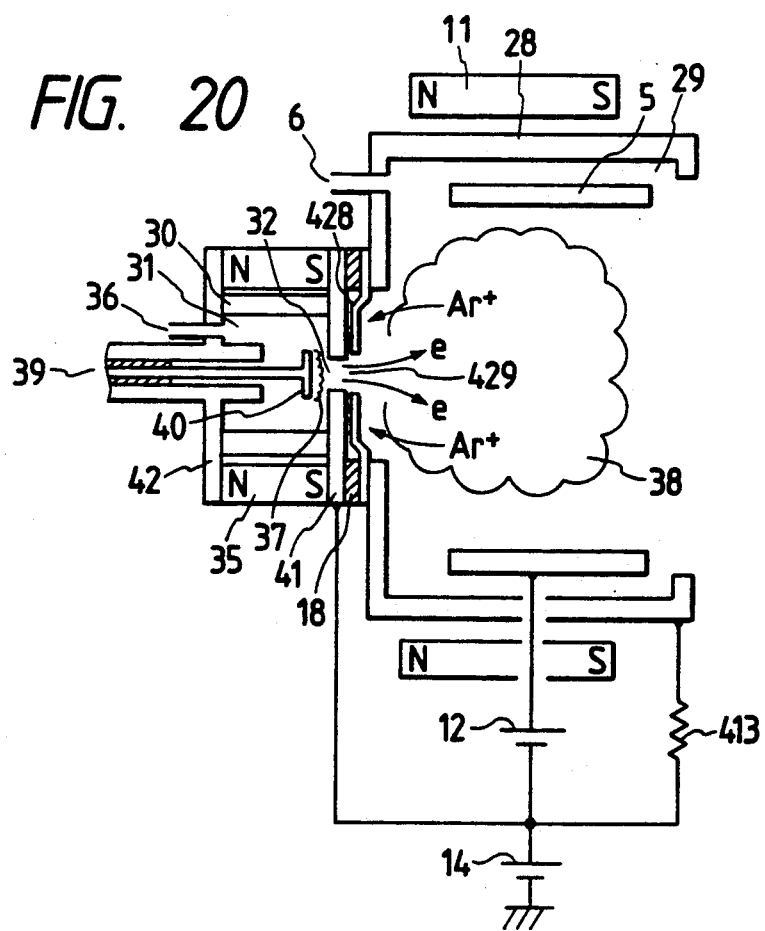
FIGS. 20 to 24 diagrams of ion sources as embodiments 12, 13, 14, 15, 16 of the present invention.

Like the protective plate 428 of FIG. 20, the potential of the protective material 430 exposed to the main plasma 38 is based on the difference in potential between the main plasma 38 and the subplasma 37 and controlled so that it is higher than the potential in the auxiliary plasma chamber 31 and set to float at a level lower than the potential in the main plasma chamber 29. The effect similar to what has been described with reference to FIG. 20 is obtainable.

Embodiment 14

An embodiment 14 will subsequently be described with reference to FIG. 22.

A disc-like screen plate 431 supported with legs 432 on the main plasma side 38 of the protective plate 428 of FIG. 20. Like the protective plate 428, the screen plate 431 is made of metal such as stainless steel, molybdenum or the like having a low sputtering coefficient and used to cover the electron emitting port 32 and the opening 429 of the protective plate 428 in such a manner that the auxiliary plasma chamber 31 is not directly exposed as viewed from the main plasma 38.

The screen plate 431 is connected via the legs 432 to the protective plate 428 and so biased that the screen plate 431 and the protective plate 428 are at the same potential. The high-energy ions of the main plasma 38 attempting to pass through the electron emitting port 32 to enter the cathode chamber 31 are therefore mostly screened by the screen plate 431.

Those ions that have not been blocked by the screen plate 53 are screened by the protective plate 428. The high-energy ions of the main plasma 38 are surely prevented from penetrating into the auxiliary plasma chamber 31 to ensure that the auxiliary plasma chamber 31 is also prevented from being damaged and contaminated.

The shape of the screen plate 431 is not limited to a disc but may be of a type capable of keeping the auxiliary plasma chamber 31 from being directly viewed from the main plasma 38.

Embodiment 15

An embodiment 15 will subsequently be described with reference to FIG. 23.

Figure 22:
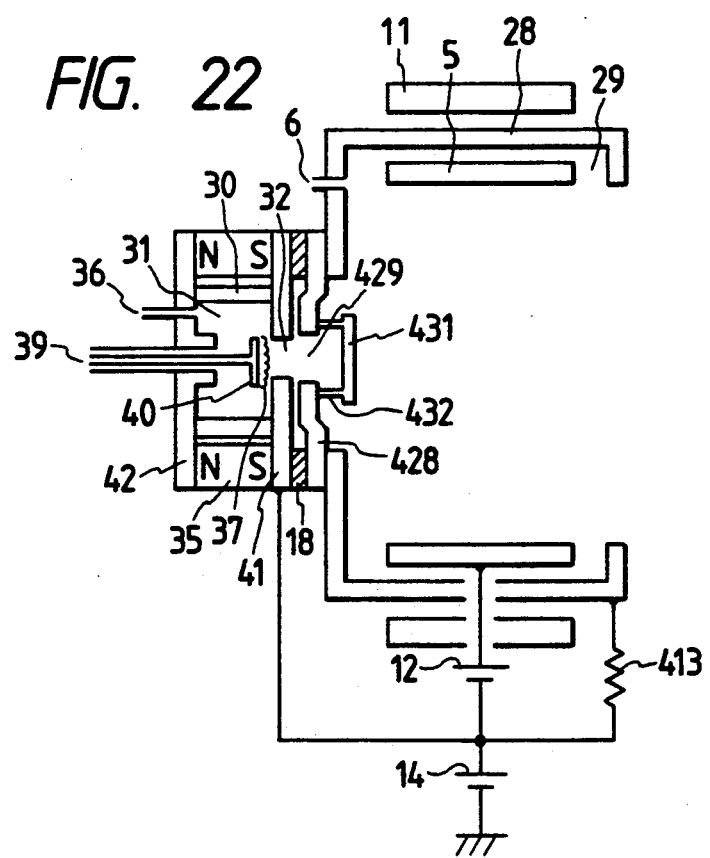

What makes this embodiment different from FIG. 22 includes the provision of an insulator 433 between the main cubic body 28 and the protective plate 428 and a connection of the protective plate 428 together with the screen plate 431 to an independent biasing d.c. power source 434.

Figure 23:
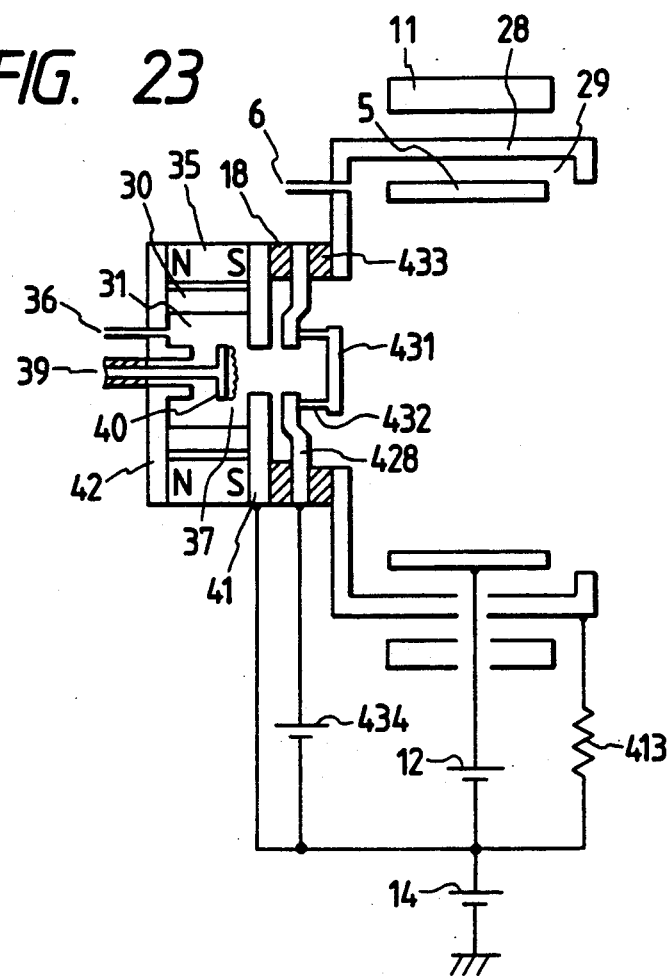

The potential of the protective plate 428 and the screen plate 431 is determined by the power source 434, irrespective of the state of the main plasma and subplasma, so that the potential of both the plates 428, 431 can be optimized to ensure improved preventive effect further than the case of FIG. 23.

Embodiment 16

Figure 24:
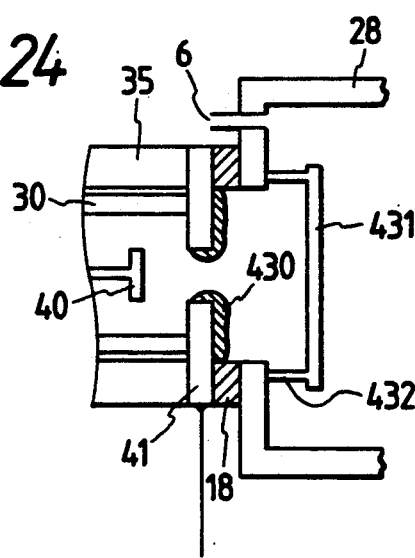

An embodiment 16 will subsequently be described with reference to FIG. 24.

In this embodiment, a screen plate 431 is fitted to the main cubic body 28 by means of legs 432, rather than being connected, as in FIGS. 22 and 23, to the protective plate 428.

The screen plate 431 is subjected to floating control even in this case so as to bring about the same effect as that of FIG. 22.

Although the coaxial cable 39 and the antenna 40 have been employed as means for supplying microwaves to the auxiliary plasma chamber 31 in each of the foregoing embodiments, a waveguide may needless to say be used instead. The present invention is also applicable to the bucket-type ion source.

Since the embodiments 12 to 16 are thus constituted, the following effects are ensured:

The protective plate 428 or the protective material 430, each having a potential higher than that of the auxiliary plasma chamber 31, to the main plasma 38 whereas the cubic wall of the auxiliary plasma chamber 31, are protected from such exposure. The high-energy ions of the main plasma are caused to sputter the protective plate 428 or the protective material 430. However, the sputtering energy is lower than that of ions emitted from the protective plate 428 and the protective material 430 against the aforementioned cubic wall. As a result, the main plasma chamber 29 will not be contaminated and the generation efficiency and life of the ion beams will not decrease because of the abnormal condition of the main plasma chamber, whereas continuous operation of the system for hours becomes possible. Moreover, impurities are prevented from mixing with the ion beams and the purity of the ion beams will not deteriorate.

The provision of the screen plate 431 makes it possible to screen the high-energy ions of the main plasma from penetrating into the auxiliary plasma chamber 31, thus preventing the auxiliary plasma chamber 31 from being damaged and contaminated likewise.

What is claimed is:

1. An ion source, comprising:
    an auxiliary plasma chamber having a gas inlet for ionization and an electron emitting port disposed therein;
    high-frequency discharge means for generating a subplasma by ionizing the gas introduced into said auxiliary plasma chamber;
    a main plasma chamber;
    an electric insulator, said main plasma chamber being connected via said electric insulator to the electron emitting port of said auxiliary plasma chamber, electrons being emitted from said auxiliary plasma chamber into said main plasma chamber;
    d.c. voltage applying means for generating a main plasma in said main plasma chamber by means of d.c. discharge; and
    means for drawing ions from the main plasma generated in said main plasma chamber and for forming ion beams.

2. An ion source as claimed in claim 1, wherein said means for generating a subplasma comprises a microwave waveguide connected to said auxiliary plasma chamber and means for supplying microwaves via said waveguide to said auxiliary plasma chamber.

3. An ion source as claimed in claim 1, wherein said means for generating a subplasma comprises, an antenna in said auxiliary plasma chamber, a coaxial cable connected to said antenna, and means for supplying high-frequency energy to said coaxial cable to cause said antenna to introduce microwave energy into said auxiliary plasma chamber.

4. An ion source as claimed in claim 1, wherein said high frequency discharge means for generating a subplasma comprises means for generating a high-frequency discharge on the order of MHz.

5. An ion source as claimed in any of claims 1–4, wherein said d.c. voltage applying means comprises a voltage source having a negative pole connected to said auxiliary plasma chamber and a positive pole connected to an anode electrode provided in the main plasma.

6. An ion source as claimed in any of claims 1–4, further comprising additional auxiliary plasma chambers, substantially identical to said first auxiliary plasma chamber, attached via insulators to said main plasma chamber.

7. An ion source as claimed in claim 6 further comprising, regulator means for individually regulating the subplasma generated by each said auxiliary plasma chamber.

8. An ion source as claimed in claim 7, wherein said regulator means comprises a plurality of series connections of current detectors and variable d.c. power sources, each said series connection connected between said anode electrode means and one of said auxiliary plasma chambers, respectively, and control means responsive to the currents detected by said current detectors for controlling the voltages of said variable d.c. power sources, respectively.

9. An ion source as claimed in claim 7, wherein said regulator means comprises a plurality of series connections of current detectors and variable impedances, each said series connection connected between said d.c. voltage applying means and one of said auxiliary plasma chambers, respectively, and control means responsive to the currents detected by said current detectors for controlling the impedances of said variable impedances, respectively.

10. An ion source as claimed in any of claims 2 or 3 further comprising; additional auxiliary plasma chambers substantially identical to said first mentioned auxiliary plasma chamber and each being connected to said main plasma chamber via an insulator; and further comprising, separate controllable microwave sources for feeding microwaves to said auxiliary plasma chambers, respectively; a plurality of current detectors, one for each auxiliary plasma chamber, connected to said d.c. voltage applying means and said auxiliary plasma chambers, respectively; and control means responsive to the currents detected by said current detectors for controlling the microwave power of said controllable microwave sources, respectively, to regulate the subplasma generated by said auxiliary plasma chambers.

11. An ion source as claimed in claim 10, wherein said separate controllable microwave sources comprises, a common source of microwave power, a branch circuit having an input connected to said common source of microwave power and a plurality of outputs, a plurality of microwave regulators controlled by said control means, connected respectively between said plurality of outputs and said auxiliary plasma chambers.

12. An ion source as claimed in claim 3, wherein said antenna provided in said auxiliary plasma chamber is made of conductive material having a high melting point and has an exposed portion covered with a protective coating having a high melting point, a lower sputtering coefficient and highly oxygen-resistant properties.

13. An ion source as claimed in claim 1, further comprising a protective plate provided between said auxiliary plasma chamber and said main plasma chamber, and positioned to protect the external joining wall of said auxiliary plasma chamber from being bombarded by ions of the main plasma chamber, said protective plate being so biased as to have potential higher than that of said auxiliary plasma chamber but lower than that of said main plasma chamber.

14. An ion source as claimed in claim 13, wherein said protective plate is attached to said electric insulator on the auxiliary plasma side of said protective plate and is attached directly to said main plasma chamber on the other side thereof.

15. An ion source as claimed in claim 1-3, further comprising a protective material made of insulating material coated on a wall of said auxiliary plasma chamber facing said main plasma chamber.

16. An ion source as claimed in any of claims 1-3, further comprising a screen plate used to cover said electrode emitting port of said auxiliary plasma chamber, but at a distance therefrom, in order to screen ions from penetrating from said main plasma chamber to said auxiliary plasma chamber, said screen plate being so biased as to have a potential higher than that of said auxiliary plasma chamber but lower than that of said main plasma chamber.

17. An ion source as claimed in claim 13, further comprising a screen plate used to cover said electron emitting port of said auxiliary plasma chamber, but at a distance therefrom, in order to screen ions from penetrating from said main plasma chamber to said auxiliary plasma chamber, said screen plate being so biased as to have potential higher than that of said auxiliary plasma chamber but lower than that of said main plasma chamber.

18. An ion source comprising:
an auxiliary plasma chamber having a gas inlet for ionization at one end thereof and an electron emitting port at the other end thereof;
high frequency discharge means for generating a subplasma by ionizing the gas introduced into said auxiliary plasma chamber;
a main plasma chamber;
an electric insulator;
said main plasma chamber being connected via said electric insulator to the electron emitting port of said auxiliary plasma chamber;
d.c. voltage applying means for generating a main plasma in said main plasma chamber by means of d.c. discharge;
means for drawing ions from the main plasma generated in main plasma chamber and for forming ion beams;
a protective plate provided between said auxiliary plasma chamber and said main plasma chamber, and positioned to protect the external joining wall of said auxiliary plasma chamber from being bombarded by ions of the main plasma chamber, said protective plate being so biased as to have potential higher than that of said auxiliary plasma chamber but lower than that of said main plasma chamber; and,
a second electric insulator separating said auxiliary and main plasma chambers, and wherein said protective plate is positioned sandwiched between said first and second insulators.

* * * * *